United States Patent
Drafts et al.

[19]

[11] Patent Number: 5,874,848
[45] Date of Patent: Feb. 23, 1999

[54] ELECTRIC CURRENT SENSOR UTILIZING A COMPENSATING TRACE CONFIGURATION

[75] Inventors: William A. Drafts, Orlando; George V. Grama, Winter Park, both of Fla.

[73] Assignee: Bell Technologies, Inc., Orlando, Fla.

[21] Appl. No.: 891,878

[22] Filed: Jul. 9, 1997

[51] Int. Cl.⁶ .................................................. G01R 33/02
[52] U.S. Cl. ...................... 327/511; 324/117 H; 324/251
[58] Field of Search ........................ 327/511; 324/117 H, 324/225, 251

[56] References Cited

U.S. PATENT DOCUMENTS

| | | | |
|---|---|---|---|
| 3,544,867 | 12/1970 | Green | 327/511 |
| 3,551,706 | 12/1970 | Chapman | 327/511 |
| 4,488,164 | 12/1984 | Kazarinov et al. | 357/27 |
| 5,136,239 | 8/1992 | Josephs | 324/210 |
| 5,146,156 | 9/1992 | Marcel | 324/127 |
| 5,416,407 | 5/1995 | Drafts | 324/117 H |

*Primary Examiner*—Timothy P. Callahan
*Assistant Examiner*—An T. Luu
*Attorney, Agent, or Firm*—Stein, Schifino & Van Der Wall

[57] ABSTRACT

An electric current sensor employing a Hall effect generator and a ferrite substrate to be used in the measuring of electrical currents flowing in a current carrying conductor comprising a toroid core having a first and a second gap, a Hall effect generator, a current source, an amplifier, and a trace configuration positioned on the substrate for electrically coupling the amplifier to the Hall effect generator. The toroid core and ferrite substrate forming the complete magnetic circuit for the flow of the magnetic field. The trace configuration thereby being routed so as to be exposed to the magnetic field in two different impinging directions so to compensate for any unwanted induced voltages from being introduced into the output voltage thereby achieving an improved transient response.

10 Claims, 4 Drawing Sheets

ELECTRIC CURRENT SENSOR UTILIZING A COMPENSATING TRACE CONFIGURATION

BACKGROUND OF THE INVENTION

1. Field of the Invention

This invention relates to an electric current sensor and, more particularly, to a transient response compensated current sensor that utilizes a Hall effect generator and includes a trace configuration routed to be exposed to the magnetic field in two different impinging directions and may further include a ferrite substrate to complete the magnetic flow path.

2. Description of the Background Art

Presently, many types of electrical current sensing sensors are known and are in wide use today throughout the electronics industry. Many of these sensors include a Hall effect generator that senses the magnetic field associated with an electrical current and, in turn, produces a Hall effect output voltage that is proportional to the magnetic field. However, many applications involve the measurement of an alternating or transient current. In these applications, errors in the Hall effect voltage will occur due to the changing magnetic field associated with the measured time varying current.

More particularly, the Hall effect output voltage is the voltage produced across opposite edges of an electrical current-carrying conductor when placed in a magnetic field. The basis of this effect, which depends upon the deflection of charged particles moving in a magnetic field is the Lorentz Force ($F=Q$ ($V \times B$)). This force is in a direction mutually perpendicular to the path of the particle movement and the magnetic field direction. As a result, an output voltage occurs across the Hall effect generator. This output voltage has a magnitude that depends upon the magnitude and angle of the impinging magnetic field, the Hall coefficient and the excitation current in the Hall effect generator. When the excitation current is held constant, the output voltage is proportional to the magnetic field produced by the current being sensed or measured.

Hall effect generators generally comprise a layer of homogeneous semiconductor material, known as the Hall plate, constructed upon a dielectric substrate. The excitation current is applied to the Hall plate through the use of contacts positioned on opposite ends of the Hall plate. When the Hall effect generator is placed in a magnetic field and supplied with excitation current, the Hall effect output voltage is produced in the Hall plate which is orthogonal to the magnetic field and the excitation current. In order to measure this Hall effect output voltage, output leads are attached to the Hall plate in a position opposite to each other and on the axis of the Hall effect output voltage. Thus, the output leads are also exposed to the magnetic field which is impinging upon the Hall effect generator.

As a result of the output leads being exposed to the magnetic field, unwanted voltages will be induced into the leads due to electromagnetic coupling occurring when the current being sensed is a time varying current. These induced voltages will add to the actual Hall effect output voltage formed in the Hall plate and cause errors in the measurement of the sensed current. As the magnitude and frequency of the time varying magnetic field increase, the induced voltages in the output leads will become larger and larger as compared to the actual Hall effect output voltage that is produced in the Hall plate.

Various types of sensing devices utilizing the Hall effect phenomena have been used in the past with an attempt to eliminate the error causing induced voltages in the output leads of the Hall generator. One example of a method for compensating for the induced voltages is seen in U.S. Pat. No. 3,551,706 (commonly assigned with this application), the disclosure of which is hereby incorporated by reference herein. In this patent, a pickup loop is mounted on the dielectric substrate of the Hall effect generator in an area aligned with the normal sensitivity area of the Hall plate also constructed on the substrate. The pickup loop is positioned in close proximity to the Hall plate to sense the same flux as that which impinges upon the Hall plate. The pickup loop is connected to the Hall effect generator output leads and is made much larger than any other loops formed by the output leads. The output leads including the pickup loop are then connected to a circuit which has a frequency response that complements the response produced by the interaction of the responses of the Hall plate, the pickup loop and the output leads to the impinging flux, thereby providing a resultant output response from the circuit that is flat within wide frequency ranges up to 4 MHz.

The Hall effect sensor disclosed in U.S. Pat. No. 3,551,706 achieved substantial commercial success. However, the difficulty in both manufacture and tuning the circuit during test compromised the economics of the sensor.

Another example of a method for compensating for the induced voltages is seen in U.S. Pat. No. 5,416,407 (commonly assigned with this application), the disclosure of which is hereby incorporated by reference herein. In this patent, an inductive loop is positioned on a PCB board at the edge of the gap of a toroid core such that the inductive loop is exposed to the same impinging magnetic field as the Hall plate. The inductive loop is then connected in series opposition to the output leads of the Hall generator such that the induced voltages from the inductive loop are canceled out with the induced voltages from the output leads of the Hall generator.

This alternative has proven to be commercially acceptable as well, however, the additional inductive loop incorporated therein also acts as an antenna to external fields and does not completely cancel the original unwanted signal due to limiting manufacturing tolerances.

Therefore, it is an object of this invention to provide an improvement which overcomes the aforementioned inadequacies of the prior art devices and provides an improvement which is a significant contribution to the advancement of the electrical current sensing art.

Another object of this invention is to provide a current sensor that provides for the compensation of unwanted induced voltages thereby providing an improved transient response when measuring time varying currents.

Another object of this invention is to provide a current sensor that utilizes a half toroid core and a ferrite substrate to complete the magnetic circuit thereby reducing costs of manufacture and overall size.

Another object of this invention is to provide a current sensor that employs a Hall effect generator having no inductive lead frame lending itself to a more cost effective device that provides for repeatability from unit to unit.

Another object of this invention is to provide a current sensor for sensing electrical current in a current carrying conductor, the current sensor comprising in combination: a substrate having a planar surface; a toroid core coupled relative to the substrate, the toroid core forming a first and a second gap relative to the substrate and facilitating the flow of a magnetic field; a Hall effect generator coupled to the planar surface, the Hall effect generator being free of inductive leads and positioned within the first gap; current source means for providing a control current to the Hall effect generator, the current source means being electrically coupled to the Hall effect generator; amplifier means for amplifying the output voltage from the Hall effect generator; and a trace configuration, the trace configuration being electrically coupled to the amplifier means and to the Hall effect generator, the trace configuration being positioned on the substrate so as to be exposed to the magnetic field in two different impinging directions; whereby the magnetic field created in the toroid core flows across the gap and across the Hall effect generator when electrical current flows through the current carrying conductor, the Hall effect generator producing an output voltage that is proportional to the magnetic field, the trace configuration providing for compensation of any unwanted induced voltages from being introduced into the output voltage thereby achieving an improved transient response.

The foregoing has outlined some of the more pertinent objects of the invention. These objects should be construed to be merely illustrative of some of the more prominent features and applications of the intended invention. Many other beneficial results can be obtained by applying the disclosed invention in a different manner or by modifying the invention within the scope of the disclosure. Accordingly, other objects and a more comprehensive understanding of the invention may be obtained by referring to the summary of the invention, and the detailed description of the preferred embodiment in addition to the scope of the invention defined by the claims taken in conjunction with the accompanying drawings.

SUMMARY OF THE INVENTION

In the sensing of time varying currents, problems exist with the current sensors generally available today in the industry. Specifically, unwanted induced voltages are being produced in the output leads that extend from the standard Hall effect generators that are commonly being utilized in the sensors of today. These output leads facilitate electrically coupling the output voltage to an amplifier, but, also act to produce voltage transients when exposed to impinging magnetic fields. However, the present invention serves to alleviate this induced voltage problem that is normally associated with the measuring of time varying currents.

In better understanding the present invention, the invention is defined by the appended claims with the specific embodiment shown in the attached drawings. For the purpose of summarizing the invention, the invention comprises an electric current sensor employing a Hall effect generator and a specific trace configuration to be used in measuring electrical currents flowing in an electrical current carrying conductor. The current sensor comprises a substrate having a planar surface, a toroid core having a first and a second gap relative to the substrate, a Hall effect generator coupled to the planar surface and being positioned within the first gap, a current source means for providing a control current to the Hall effect generator, an amplifier means for amplifying the output voltage from the Hall effect generator, and a trace configuration for electrically coupling the amplifier to the Hall effect generator, the trace configuration being specifically routed so as to be exposed to the magnetic field created in the toroid in two different impinging directions thereby compensating for any unwanted induced voltages from being introduced into the output voltage and, hence, achieving an improved transient response.

The trace configuration itself is comprised of output voltage traces and control current traces that are deposited on the planar surface of the substrate and facilitate electrically coupling the current source means and the amplifier means to the Hall effect generator. The significance of the trace configuration is that the output voltage traces are routed so as to be exposed to the magnetic field in two different impinging directions flowing through the toroid core. In doing so, the different impinging directions of the magnetic field produced equal but positive and negative induced voltages in the output traces such that cancellation occurs of the induced voltages thereby providing a highly accurate measurement.

As is common in the industry, the electrical conductor whose current is to be sensed is positioned through the toroid core. The current source provides the Hall effect generator with a constant temperature-compensated low level control current. The electrical current flowing through the current carrying conductor generates a proportional magnetic field in the toroid core which, in turn, impinges upon the Hall effect generator. The Hall effect generator in turn, resultantly produces an output voltage that is proportional to the concentrated impinging magnetic field. This output voltage is then amplified by the amplifier to a useful level. It is important to note herein that the present invention utilizes a toroid core that provides for two gaps so to facilitate the routing of the output voltage traces of the trace configuration so to pass through both gaps formed by the toroid core. By doing so the direction of the impinging magnetic field will be opposite of each other thereby inducing opposite voltages in the output voltage traces. It is important also to note herein that the trace configuration, being fabricated in the form of electrical traces deposited directly on the planar surface of the substrate, ensures a low-cost, ease of manufacture and a controlled process which gives excellent unity and repeatability.

Another important aspect of the present invention is that the Hall effect generator used herein and placed within the first gap of the toroid core is packaged in such a way so as not to have inductive leads extending outward from the packaged unit. Thus, the Hall effect generator to be used in the present invention is small and relatively thin, facilitating use with small gaps in the toroid core which increases the flux flow density of the magnetic field and provides for more sensitive, accurate and efficient measurements.

An alternate embodiment of the present invention further includes a substrate that is formed from a ferrite material thereby alleviating the need for a full toroid core and facilitating the use of a half toroid core coupled to the planar surface of the substrate. The ferrite substrate facilitates completing the magnetic circuit with the half toroid core. This removes a large part of the expense of manufacturing the device in that the toroid core is the item of most expense. It is important to note that, even with the half toroid core being utilized, two gaps are formed between the toroid core and the ferrite substrate such that the trace configuration can be routed so to be exposed to the magnetic field in two different impinging directions and provide for the compensation of any unwanted induced voltages that may be generated in the output voltage traces.

In a second alternate embodiment, the half toroid core is positioned on the ferrite substrate so as to form two gaps wherein each is to receive a Hall effect generator positioned within. Thus, a second Hall effect generator is utilized to provide enhanced sensitivity and accuracy in the sensing of time varying currents. Once again, the first and second gaps formed by the half toroid core continue to provide for the trace configuration to be routed therethrough thereby facilitating exposure to the magnetic field in two different impinging directions.

An important feature of the present invention is that the current sensor has an improved transient response which results in more accurate measurements of sensed time varying currents.

Another important feature of the present invention is that the current sensor employs a trace configuration such that the output leads are routed so as to be exposed to the magnetic field in two different impinging directions thereby providing for compensation of any unwanted induced voltages.

Another important feature of the present invention is that the current sensor is capable of employing a ferrite substrate thereby facilitating the use of only one half of a toroid core in cooperation with the ferrite substrate to form the complete magnetic circuit. By using only one half of a toroid core the overall cost of manufacture of the current sensor of the present invention is greatly reduced.

Another important feature of the present invention is that the current sensor employs reduced gap widths which facilitate increased flux density, improved sensitivity and a reduced power consumption.

Another important feature of the present invention is that the current sensor is capable of employing a second Hall effect generator positioned in the second gap of the toroid core so as to enhance sensitivity and further improve the accuracy of measuring time varying currents.

The foregoing has outlined rather broadly, the more pertinent and important features of the present invention. The detailed description of the invention that follows is offered so that the present contribution to the art can be more fully appreciated. Additional features of the invention will be described hereinafter. These form the subject of the claims of the invention. It should be appreciated by those skilled in the art that the conception and the disclosed specific embodiment may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more succinct understanding of the nature and objects of the invention, reference should be directed to the following detailed description taken in connection with the accompanying drawings in which.

Similar reference characters refer to similar parts throughout the several views of the drawings.

DETAILED DESCRIPTION OF THE PREFERRED EMBODIMENT

Figure 1:
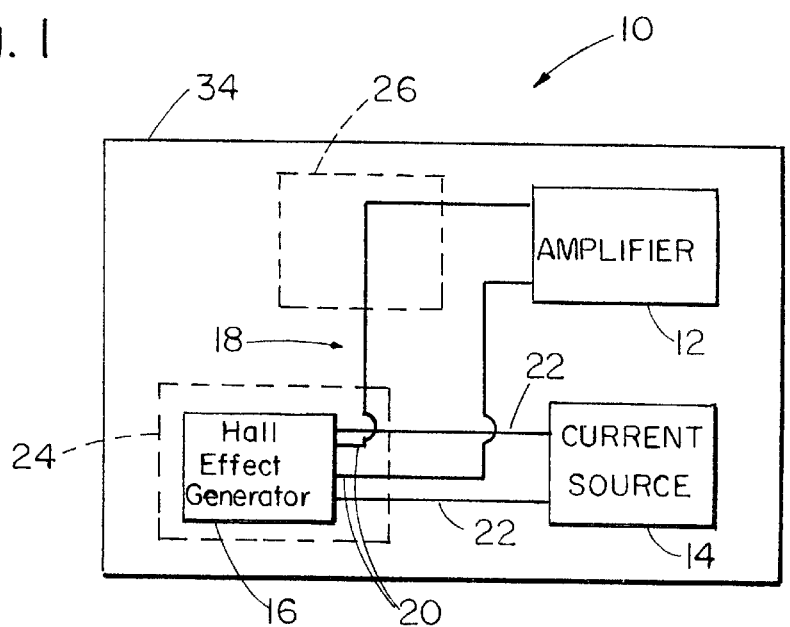
FIG. 1 is a block diagram representation of the amplifier means, the current source means, the Hall effect generator and the trace configuration in their relative positions to each other in the current sensor of the present invention.

In referring to FIG. 1, the current sensor 10 of the present invention can be seen to comprise an amplifier means, generally indicated by reference numeral 12, a current source means, generally indicated reference numeral 14, a Hall effect generator 16 and a trace configuration, generally indicated by reference numeral 18. The Hall effect generator 16 is generally comprised of a standard design having a semiconductor Hall plate (not shown) mounted onto a dielectric substrate (not shown). The trace configuration 18 can be seen to specifically include output voltage traces 20 and control current traces 22. It can be further seen that the amplifier means 12 is electrically coupled to the Hall effect generator 16 by way of the output voltage traces 20. Further indicated in FIG. 1, is the region of magnetic field exposure 24 encompassing the Hall effect generator 16 and the region of magnetic field exposure 26 within which the trace configuration 18 is routed therethrough so to achieve the compensation for any unwanted induced voltages that may be generated in the output voltage traces 20.

Suitable Hall effect generators can be made from bulk indium arsenide (InAs), thin film InAs, gallium arsenide (GaAs) and indium antimonide (InSb). It is preferable that the Hall effect generator 16 to be used in the present invention be formed from thin film InAs so as to achieve a high sensitivity due to the higher Hall mobility and lower resistivity associated with this material. Ultimately, the specific application will dictate the type of material that is used for the Hall effect generator 16 that has that exact properties needed. However, trade-offs must be considered by the designer when choosing a specific thickness of the Hall effect generator 16 for a specific application since thinner designs have higher input and output resistances. It is desired to have low input and output resistances which facilitate low noise, low loading concerns and a low voltage drop. The lower the voltage drop, the lower the power consumption of the current sensor 10 will be under operation.

Figure 2:
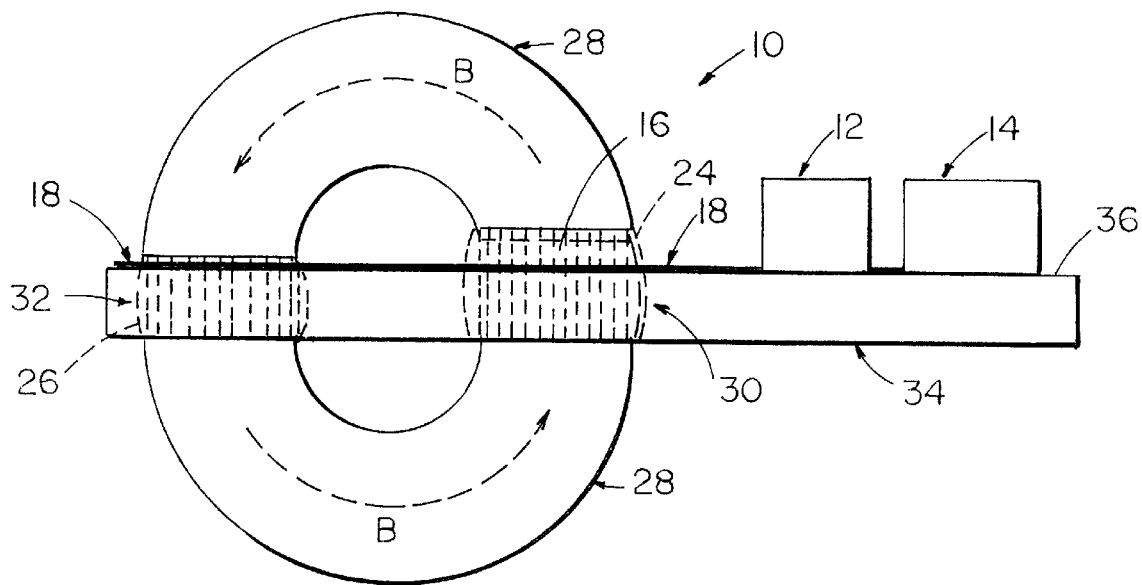
FIG. 2 is a front elevational view of the current sensor of the present invention illustrating the relative positions of the toroid core, the first and second gaps, the Hall effect generator, the amplifier means, the current source means, the trace configuration and the substrate to each other.

In referring now to FIG. 2, a front elevational view of the current sensor 10 of the present invention can be seen. As illustrated, the Hall effect generator 16 is positioned within the magnetic field, represented by dashed flux lines 24, preferably concentrated by a toroid core 28 having a first gap 30 and a second gap 32. The toroid core 28 is mounted to a substrate 34 having surfaces 36, preferably planar. The toroid core 28 is mounted to the substrate 34 by way of standard dielectric adhesives currently used in the industry. In the preferred embodiment, it is preferred that aluminum oxide be used along with an epoxy to adhere the toroid core 28 to the substrate 34 and provide the dielectric insulating layer between the toroid core 28 and the trace configuration 18. It is noted, however, that many other dielectric materials having suitable adhesive characteristics may be utilized to perform the adhering and insulating functions.

FIG. 2 further illustrates the placement of the amplifier means 12 and the current source means 14 on the substrate 34. The trace configuration 18 can further be seen as it is routed through the first and second gaps 30 and 32 of the toroid core 28. The Hall effect generator 16 can be seen positioned within the first gap 30 and exposed to the magnetic field 24. With the Hall effect generator 16 placed within the gap 30, within the concentrated flow of the magnetic field 24 and with the current source means 14 supplying a control current, an output voltage will resultantly be formed by the Hall effect generator 16 that is proportional to the current flowing in a current carrying conductor (not shown) when the current carrying conductor is placed in cooperative position relative to the toroid core 28 facilitating magnetic coupling.

It is important that the amplifier means 12 be electrically coupled to the Hall effect generator 16 by way of the trace configuration 18 which is routed through both of the first and second gaps 30 and 32 of the toroid core 28. The magnetic field 24 flows across the gap 30 of the toroid core 28 and impinges upon the Hall effect generator 16 and the trace configuration 18. It is preferable that the substrate 34 be formed from a ferrite material suitable for efficient flow of the magnetic fields 24 and 26 across the respective first and second gaps 30 and 32. It is also preferable that the substrate 34 be of a relatively thin dimension so as to minimize the gaps 30 and 32 thereby facilitating a more thorough and concentrated flow of the magnetic field through the toroid core 28. It is noted that a thin suitable insulating dielectric material (not shown for clarity sake) is placed over the trace configuration 18 so as to insulate the voltage output traces and control current traces 22 from the toroid core 28. There are many suitable dielectric materials that may be used.

In selecting the appropriate packaging of the Hall effect generator 16 for use in the present invention, it is preferable that the Hall effect generator 16 be in the form of a flip chip packaged device that facilitates being surface mounted to the planar surface 36 of the substrate 34. The Hall effect generator 16, in the form of a flip chip package device, is preferably mounted to the substrate 34 by way of standard soldering methods commonly used in the industry. It is further noted herein that the Hall effect generator 16 may be manufactured directly onto the substrate using standard semiconductor processes. Exemplary processes include chemical vapor deposition, metal organic chemical vapor deposition, molecular beam epitaxy or ion beam implantation. For the present invention, it is preferable that standard surface mount soldering methods commonly used in the industry also be utilized for electrically coupling the amplifier means 12, the current source means 14 and the Hall effect generator 16 to the trace configuration 18.

Figure 3:
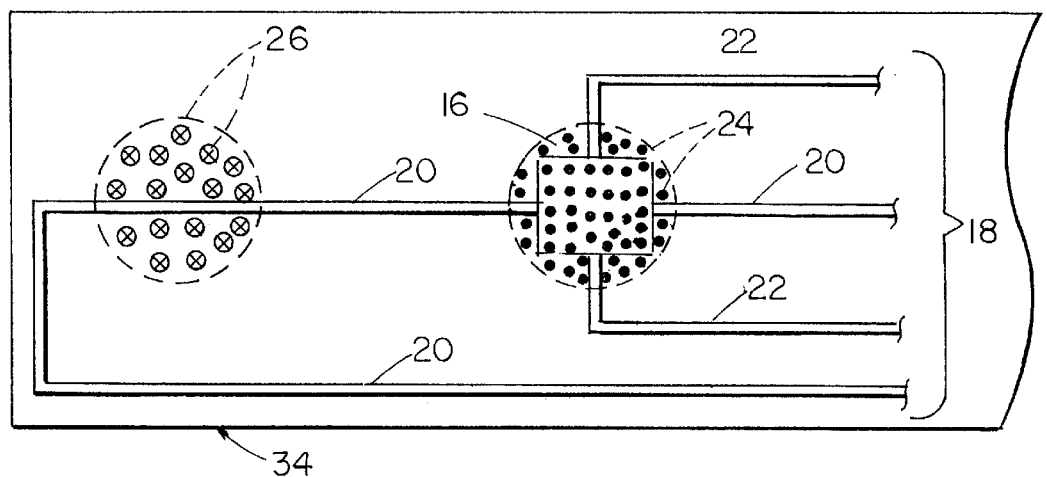
FIG. 3 is a partial detailed top plan view of the trace configuration illustrating the output voltage traces, the control current traces, the Hall effect generator and the regions of exposure of the magnetic field in two different impinging directions.

In referring now to FIG. 3, a partial detailed top plan view of the trace configuration 18 can be seen illustrating the specific layout. The trace configuration 18 can be seen to be comprised of output voltage traces 20 and control current traces 22. The output voltage traces 20 can be seen to be electrically coupled to the Hall effect generator 16 and positioned within the region of exposure of the magnetic field 24 and subsequently routed through the region of exposure of the magnetic field 26 and continuing its loop to the amplifier means 12. Thus, by way of being routed through the exposure regions of the magnetic fields 24 and 26, the output voltage traces 20 will be exposed in two equal but opposite impinging directions. The region of exposure of the magnetic field 24 can be seen as represented by a dotted line having dots to indicate that the magnetic field 24 is coming out of the page. The region of exposure of the magnetic field 26 can be seen as indicated by a dotted line having circles with crosses within to indicate the magnetic field 26 going into the page. Hence, the output voltage traces 20 are exposed to the magnetic field in two different impinging directions (equal in magnitude but opposite in direction) producing equal but opposite flux inside the loop formed by the output voltage traces 20 which thereby achieves an effective zero induced voltage.

Figure 8:
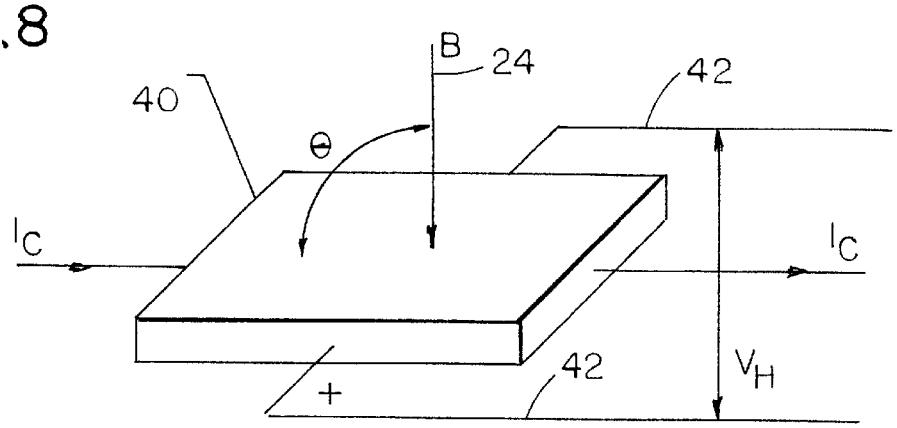
FIG. 8 is a perspective view of a typical Hall effect generator illustrating the operation of the Hall effect phenomenon and the relative relationships of the magnetic field, the control current and the Hall effect voltage.

Now that the structure of the current sensor 10 has been described in detail, its operation may readily be understood. In referring now to FIGS. 8 and 9 for the purposes of describing the general operation of typical Hall effect generators, a typical Hall effect generator 40 can be seen illustrating the typical relationship of the magnetic field B, the magnetic field angle θ, the control current $I_c$ and the output voltage $V_h$ to one another. It can be seen that the control current $I_c$ flows across the typical Hall effect generator 40 having a magnetic field B impinging upon the typical Hall effect generator 40 from a direction having an angle θ that is perpendicular to the flow of the control current $I_c$. The output voltage $V_h$ produced in response to the magnetic field B and the control current $I_c$ is a differential voltage taken across the typical Hall effect generator 40 having an orthogonal relationship to the control current $I_c$ and the magnetic field B. The output voltage $V_h$ is created due to a phenomenon known as the "Hall effect". According to the "Hall effect" a particle with charge Q and velocity V moving within a magnetic field B experiences the Lorentz Force (F=Q (V×B)). In this relationship the force direction is mutually perpendicular to the directions of the particle velocity and the magnetic field. Hence, under the influence of this force, the electrons resultantly pile up on one edge of the conductor (Hall plate, not shown).

Figure 9:
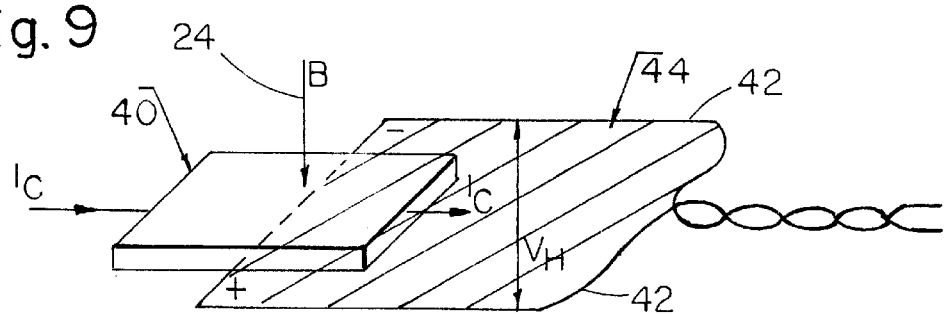
FIG. 9 is a perspective view of the typical Hall effect generator illustrating the typical output voltage electrical lead frame that normally extends from a standard Hall effect generator and presents an inductive loop area which would be exposed to and perpendicular to the impinging magnetic field thereby being susceptible to producing unwanted induced voltages.

In now referring specifically to FIG. 9, the typical Hall effect generator 40 can be seen having a typical output voltage lead frame 42 extending therefrom which is commonly used to electrically couple the output voltage $V_h$ to additional circuitry for processing. However, it is important to note the inductive loop that is created by the lead frame 42 that is typically associated with standard Hall effect generators in the industry. This inductive loop presents a loop area 44 that is perpendicular to the directional flow of the impinging magnetic field B such that unwanted induced voltages are formed in the lead frame 42 which contribute errors to the output voltage $V_h$ and compromise measurement accuracy.

The present invention operates similarly, however, it differs slightly in that the lead frame 42 and associated loop area 44 are compensated for by the trace configuration 18 in the present invention which alleviates the inherent problems associated with typical Hall effect generator operation. The trace configuration 18 is routed through both of the regions of exposure of the impinging magnetic fields 24 and 26 that are equal in magnitude but opposite in direction facilitating cancellation of unwanted induced voltages.

In now referring back to FIGS. 1, 2 and 3, upon obtaining the output voltage from the Hall effect generator 16, the output voltage is electrically coupled to the amplifier means by way of the trace configuration 18 wherein the output voltage is amplified to a useful level, detected and then correlated with a representative current amount.

Figure 4:
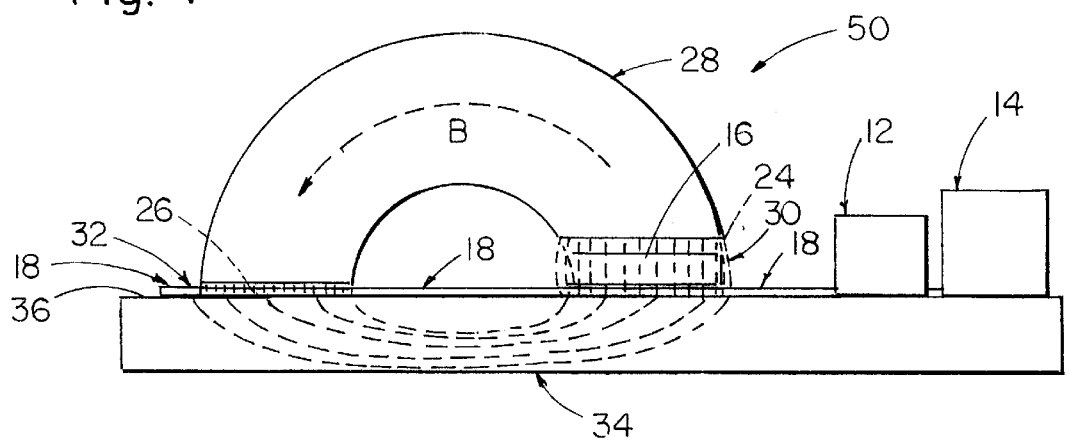
FIG. 4 is a front elevational view illustrating an alternate embodiment of the current sensor of the present invention having a half toroid core, a ferrite substrate the Hall effect generator, the amplifier means, the current source means and the trace configuration in their relative positions to each other along with the flow of the magnetic field illustrated through the toroid core and ferrite substrate.

In referring to FIG. 4, an alternate embodiment of the present invention can be seen in the form of a current sensor 50 that utilizes a ferrite substrate 34a. The current sensor 50 can be seen to be formed in a similar fashion as the current sensor 10 described above excepting to the ferrite substrate 34a. The current sensor 50 utilizes a ferrite substrate 34a which facilitates the flow of the magnetic field therethrough so to alleviate the need for a full toroid core and requires only one-half of a toroid core. The ferrite substrate 34a completes the magnetic circuit in conjunction with the toroid core 28. As similarly described above in the current sensor 10, current sensor 50 of the alternate embodiment comprises a toroid core 28 having a first gap 30 and a second gap 32.

The toroid core 28 of the current sensor 50 in the alternate embodiment is mounted to the substrate 34a in a manner as was similarly explained above in the current sensor 10. Further, the trace configuration 18 is deposited on the planar surface 36 of the substrate 34a with a dielectric material positioned between the trace configuration 18 and the substrate 34a as well as between the toroid core 28 and trace configuration 18 for insulating purposes. The ferrite substrate 34a is preferably formed from a suitable ferrite material that matches the characteristics of the toroid core 28 so to achieve an optimally concentrated magnetic flow through the magnetic circuit. The requirement of only one half of a toroid core 28 serves to drastically reduce the cost of manufacturing the current sensor 50 of the alternate embodiment and decrease the overall size of the device in that the toroid core 28 is generally the most costly item in current sensor manufacturing.

The electrical operation of the current sensor 50 of the alternate embodiment is similar to that of the current sensor 10 as explained above excepting to the magnetic circuit being completed via the toroid core 28 and the ferrite substrate 34a. The current sensor 50 is further capable of utilizing smaller gaps 30 and 32 which serve to decrease power consumption.

Figure 5:
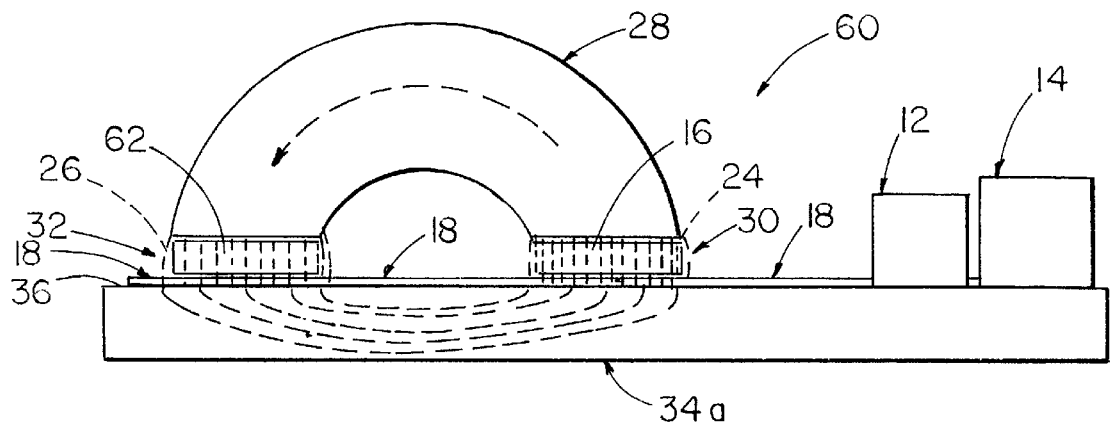
FIG. 5 is a front elevational view illustrating a second alternate embodiment of the present invention wherein a second Hall effect generator can be seen to be utilized in conjunction with the half toroid core, the ferrite substrate, the Hall effect generator, the amplifier means, the current source means and the trace configuration.
Figure 6:
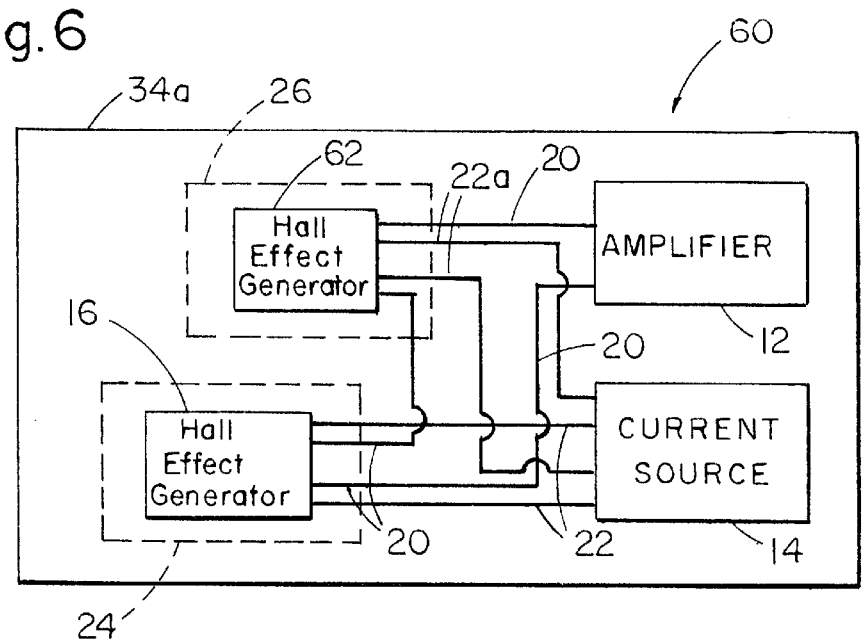
FIG. 6 is a block diagram representation of the second alternate embodiment employing the second Hall effect generator in conjunction with the first Hall effect generator, the amplifier means, the current source means, and the trace configuration.

In referring now to FIGS. 5 and 6, a side elevational view and a block diagram representation of a second alternate embodiment of the present invention can be seen. A current sensor 60 can be seen which comprises the employment of a second Hall effect generator 62 positioned within the second gap 32 of the toroid core 28. The current sensor 60 of the second alternate embodiment similarly utilizes a ferrite substrate 34a and toroid core 28 to complete the magnetic circuit as was utilized in the current sensor 50 of the first alternate embodiment. The second Hall effect generator 62 is similarly connected to the current source means 14 and the amplifier means 12 by way of the trace configuration 18. The Hall effect generator 16 and the second Hall effect generator 62 are effectively electrically coupled in series via the output voltage traces 20 of the trace configuration 18.

The use of a second Hall effect generator 62 facilitates obtaining higher current sensitivity and measurement accuracy. The second Hall effect generator 62 is electrically coupled to the current source means 14 by way of additional control current traces 22a. The electrical operation of the current sensor 60 of the second alternate embodiment is as was similarly explained above excepting to the presence of the second Hall effect generator 62 adding to the overall output voltage produced in proportion to the impinging magnetic fields 24 and 26.

Figure 7:
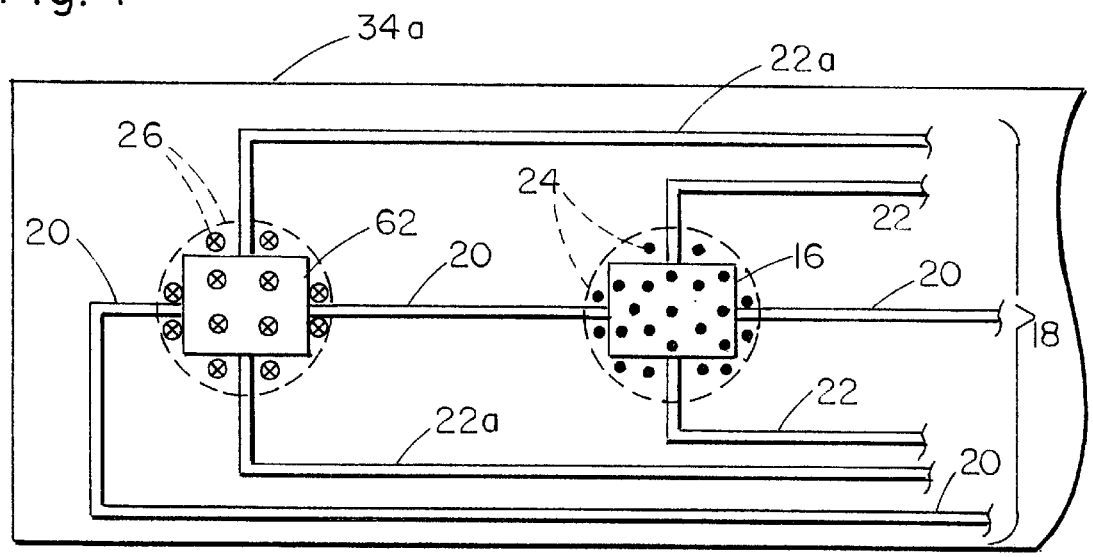
FIG. 7 is a partial detailed top plan view of the second alternate embodiment of the present invention illustrating the relative positions of the Hall effect generator, the second Hall effect generator, the output voltage traces, the control current traces and the regions of magnetic field exposure in two different impinging directions.

In referring now to FIG. 7, a partial detailed top plan view of the trace configuration 18 as utilized in current sensor 60 of the second embodiment can be seen. The second Hall effect generator 62 can be seen to have control current traces 22a and output voltage traces 20 electrically coupled thereto. The output voltage traces 20 can be seen to be electrically coupling the Hall effect generator 16 to the second Hall effect generator 62 and then to the amplifier means 12 (not shown in FIG. 7). The second Hall effect generator 62 can be seen to be positioned within the region of exposure to the impinging magnetic field 26, generally indicated by a dotted line having circles with crosses indicating an impinging magnetic field going into the page. The effective circuit equivalent of the output voltage traces 20 with the Hall effect generator 16 and second Hall effect generator 62 is that of a loop having equivalent regions of impinging magnetic fields presenting equal amounts of flux inside the loop but in opposite directions so to thereby achieve a zero induced voltage via cancellation.

It is preferable that the second Hall effect generator 62 be formed of a suitable material dictated by the specific application at hand and having operational properties matching those of the Hall effect generator 16. Suitable Hall effect generators can be made from bulk indium arsenide (InAs), thin film InAs, gallium arsenide (GaAs) and indium antimonide (InSb). It is preferable that the second Hall effect generator 62 be formed from thin film InAs so as to match the Hall effect generator 16 and achieve a high sensitivity due to the higher Hall mobility and lower resistivity associated with the use of InAs for Hall effect generator applications. As is similar to the Hall effect generator 16, the second Hall effect generator 62 is preferably in the form of a flip chip packaged device which is mounted to the substrate 34a by way of standard soldering methods commonly used in the industry. It is further noted herein that the second Hall effect generator 62 may be manufactured directly onto the substrate using standard semiconductor processes. As for the second alternate embodiment, it is preferable that standard surface mount soldering methods commonly used in the industry also be utilized for electrically coupling the amplifier means 12, the current source means 14 and the Hall effect generator 62 to the trace configuration 18.

The present disclosure includes that contained in the appended claims, as well as that of the foregoing description. Although this invention has been described in its preferred form with a certain degree of particularity, it should be understood that the present disclosure of the preferred form has been made only by way of example and that numerous changes in the details of construction and the combination and arrangement of parts may be resorted to without departing from the spirit and scope of the invention.

Now that the invention has been described,

What is claimed is:

1. A current sensor for sensing electrical current in a current carrying conductor, said current sensor comprising in combination:

a substrate having a planar surface;

a toroid core coupled relative to said substrate, said toroid core forming a first and a second gap relative to said substrate and facilitating the flow of a magnetic field;

a Hall effect generator coupled to said planar surface, said Hall effect generator being free of inductive leads and positioned within said first gap;

current source means for providing a control current to said Hall effect generator, said current source means being electrically coupled to said Hall effect generator;

amplifier means for amplifying the output voltage from said Hall effect generator; and a trace configuration, said trace configuration being electrically coupled to said amplifier means and to said Hall effect generator, said trace configuration being positioned on said substrate so as to be exposed to the magnetic field in two different impinging directions;

whereby the magnetic field created in said toroid core flows across said gap and across said Hall effect generator when electrical current flows through the current carrying conductor, said Hall effect generator producing an output voltage that is proportional to the magnetic field, said trace configuration providing for compensation of any unwanted induced voltages from being introduced into the output voltage thereby achieving an improved transient response.

2. The current sensor as recited in claim 1, wherein said substrate is comprised of a ferrite material thereby facilitating magnetic flow therethrough.

3. The current sensor as recited in claim 2, wherein said toroid core is a half toroid, said half toroid being coupled relative to said planar surface, whereby said substrate formed of ferrite material completes the magnetic flow path.

4. The current sensor as recited in claim 3, wherein said current sensor further comprises a second Hall effect generator coupled to said planar surface of said substrate and positioned within said second gap, said second Hall effect generator being electrically coupled to said amplifier means by way of said trace configuration.

5. The current sensor as recited in claim 1, wherein said trace configuration includes output leads positioned so as to pass within said first and second gaps thereby being exposed to the magnetic field in two different impinging directions and facilitating the compensation of any unwanted induced voltages in the output leads.

6. The current sensor as recited in claim 4, wherein said Hall effect generator and said second Hall effect generator are directly deposited onto said substrate.

7. The current sensor as recited in claim 4, wherein said Hall effect generator and said second Hall effect generator are in the form of flip-chip packaged devices coupled to said substrate.

8. A method for sensing current in a current carrying conductor comprising the steps of:

providing a substrate, and a toroid having a first and second gap, the toroid being coupled to the substrate;

placing the current carrying conductor in cooperative position relative to the toroid facilitating magnetic coupling;

creating a magnetic field within the toroid in proportion to the current flowing in the current carrying conductor;

providing a Hall effect generator positioned within the first gap so to be exposed to the magnetic field;

producing a Hall effect voltage proportional to the magnetic field;

electrically coupling the Hall effect voltage to an amplifier means by way of a trace configuration, the trace configuration being routed so to be exposed to the magnetic field in two different impinging directions; and detecting the amplified Hall effect voltage and correlating the value with a representative current amount.

9. The method as recited in claim 8, wherein the step of providing a substrate is comprised of providing a substrate formed of ferrite material and the toroid is in the shape of one half a toroid whereby the substrate of ferrite material completes the magnetic flow path.

10. The method as recited in claim 9, wherein the step of providing a Hall effect generator is further comprised of providing a second Hall effect generator positioned within the second gap.

* * * * *